(12) United States Patent
Nguyen et al.

(10) Patent No.: US 11,895,806 B2
(45) Date of Patent: Feb. 6, 2024

(54) ELECTRONIC ASSEMBLY HAVING SEALING RETAINER COUPLING AN ELECTRONIC MODULE AND ASSOCIATED METHOD

(71) Applicant: EAGLE TECHNOLOGY, LLC, Melbourne, FL (US)

(72) Inventors: Voi Nguyen, Oviedo, FL (US); Jason Thompson, Melbourne, FL (US); Charles Weirick, Melbourne, FL (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 0 days.

(21) Appl. No.: 17/660,842

(22) Filed: Apr. 27, 2022

(65) Prior Publication Data

US 2023/0354559 A1 Nov. 2, 2023

(51) Int. Cl.
*H05K 7/20* (2006.01)
*H05K 7/14* (2006.01)
*H05K 1/14* (2006.01)

(52) U.S. Cl.
CPC ....... *H05K 7/20563* (2013.01); *H05K 7/1422* (2013.01); *H05K 7/20545* (2013.01); *H05K 1/14* (2013.01); *H05K 1/144* (2013.01)

(58) Field of Classification Search
CPC ........... H05K 7/20563; H05K 7/20545; H05K 7/1422; H05K 1/14; H05K 1/144
USPC ........................................................ 361/689
See application file for complete search history.

(56) References Cited

U.S. PATENT DOCUMENTS

| | | |
|---|---|---|
| 3,956,673 A | 5/1976 | Seid |
| 4,277,815 A | 7/1981 | Skroupa |
| 4,375,290 A | 3/1983 | Zucchi et al. |
| 4,442,475 A | 4/1984 | Franklin et al. |
| 4,672,509 A | 6/1987 | Speraw |
| 4,829,402 A | 5/1989 | Gewebler et al. |
| 5,034,852 A * | 7/1991 | Rosenberg ......... H05K 7/20563 277/630 |
| 5,220,485 A | 6/1993 | Chakrabarti |
| 5,253,963 A | 10/1993 | Ries |
| 5,407,297 A | 4/1995 | Hulme et al. |

(Continued)

FOREIGN PATENT DOCUMENTS

| | | |
|---|---|---|
| CA | 2657056 | 9/2009 |
| EP | 2106205 A2 | 9/2009 |

(Continued)

*Primary Examiner* — Anatoly Vortman
*Assistant Examiner* — Zhengfu J Feng
(74) *Attorney, Agent, or Firm* — ALLEN, DYER, DOPPELT, + GILCHRIST, P.A. Attorneys at Law (57) ABSTRACT

An electronic assembly may include a chassis having electronic module mounting positions, each having a chassis cooling gas passageway and an electronic module received in each electronic module mounting position. A sealing retainer may be coupled between the chassis and each electronic module, and includes a cooling gas passageway aligned with the chassis cooling gas passageway and a module cooling gas passageway of a respective electronic module. The sealing retainer may include a retainer body, and a gas seal body coupled to the retainer body and movable between retracted and extended positions. The gas seal body in the retracted position permits insertion and removal of the electronic module, and in the extended position seals against the electronic module.

22 Claims, 11 Drawing Sheets (56) References Cited

U.S. PATENT DOCUMENTS

| | | | |
|---|---|---|---|
| 5,607,273 | A | 3/1997 | Kecmer et al. |
| 6,285,564 | B1 | 9/2001 | Obrien |
| 6,687,130 | B2 | 2/2004 | Adams, Sr. et al. |
| 7,324,336 | B2 | 1/2008 | Vos et al. |
| 8,208,265 | B2 | 6/2012 | Suzrez et al. |
| 8,456,846 | B2 | 6/2013 | Mosier et al. |
| 8,967,903 | B1 | 3/2015 | Sharfi |
| 9,426,931 | B2 * | 8/2016 | Kaplun .............. H05K 7/20272 |
| 9,839,116 | B2 | 12/2017 | Kirk et al. |
| 9,999,156 | B2 | 6/2018 | Holahan et al. |
| 2006/0133033 | A1 | 6/2006 | Straub et al. |
| 2007/0070601 | A1 * | 3/2007 | Vos ...................... H05K 7/1404 |
| | | | 361/694 |
| 2009/0225510 | A1 | 9/2009 | Biemer et al. |
| 2011/0176867 | A1 | 7/2011 | Mosier et al. |
| 2014/0314514 | A1 | 10/2014 | Paquette et al. |
| 2019/0380225 | A1 * | 12/2019 | Thompson ........... H05K 7/1427 |
| 2020/0337175 | A1 | 10/2020 | Krivonak et al. |
| 2021/0410330 | A1 | 12/2021 | Thompson et al. |

FOREIGN PATENT DOCUMENTS

| | | | |
|---|---|---|---|
| EP | 2106205 B1 | 1/2017 | |
| GB | 1508832 | 4/1978 | |
| GB | 2496481 | 5/2013 | |
| JP | H10256765 | 9/1998 | |
| JP | 3264203 B2 * | 3/2002 | ............... H05K 7/20 |

* cited by examiner

ELECTRONIC ASSEMBLY HAVING SEALING RETAINER COUPLING AN ELECTRONIC MODULE AND ASSOCIATED METHOD

FIELD OF THE INVENTION

The present invention relates to the field of electronic assemblies, and, more particularly, to electronic assemblies having a chassis and electronic module with cooling gas passageways and related methods.

BACKGROUND OF THE INVENTION

As electronic packaging density and dissipated power increase to achieve higher levels of electronic performance, the need for efficient thermal transport within electronic assemblies having electronic modules carrying printed circuit boards also increases. Even though electronic components are becoming smaller with greater processing capability, and operate at a much lower power, these two advantages may have a counterintuitive effect of increasing thermal density because circuit designers are expected to pack even more functionality into ever smaller circuit spaces, thus increasing heat generation and requiring more advanced cooling and thermal management.

Brute force heat transfer techniques involve forced air, active liquid cooling, and similar heat transport mechanisms to transport heat from sensitive electronic components to heat sinks or similar heat spreading devices. Some heat transfer systems even use composite structures, for example, annealed pyrolytic graphite (APG) embedded within metallic skins or heat pipes connected to spreader plates.

A new industry standard, however, encourages the increased use of convection cooling to reduce dependence on conduction cooling using 3U and 6U circuit cards. The ANSI/VITA 48.8 mechanical form-factor standard leverages air-flow-through (AFT) cooling for chassis architectures to provide increased thermal performance while mitigating risk to electronic modules carrying different electronic components. The gas, i.e., normally air, is isolated to cooling paths adjacent the circuit board and the electronic components, where there are no foreign object debris (FOD), contaminants or impingements to the airflow.

The VITA 48.8 AFT standard is directed to channeling airflow through plug-in module heat sinks that interface with a pressurized airflow manifold to reduce thermal resistances between the cooling medium and the heat-generating electronic components and provide a common framework for original equipment manufacturer (OEM) chassis and electronic module manufacturers. State-of-the-art designs that implement the VITA 48.8 AFT technology, however, may have technical drawbacks because of the complexity required in providing precision tapers on the plug-in electronic modules and the requirements for gaskets that interface components that cause binding. The gaskets may be compromised during insertion and extraction of the electronic modules.

SUMMARY OF THE INVENTION

In general, an electronic assembly may comprise a chassis having a plurality of electronic module mounting positions. Each electronic module mounting position may have a chassis cooling gas passageway. A respective electronic module may be received in each electronic module mounting position and may have a module cooling gas passageway. A respective sealing retainer may be coupled between the chassis and each electronic module. The sealing retainer may have a cooling gas passageway therethrough aligned with the chassis cooling gas passageway and the module cooling gas passageway. The sealing retainer may comprise a retainer body, and a gas seal body coupled to the retainer body and movable between retracted and extended positions. The gas seal body in the retracted position may permit insertion and removal of the electronic module, and the gas seal body in the extended position may seal against the electronic module.

A respective sealing gasket may be between each gas seal body and adjacent portions of the chassis. The chassis cooling gas passageway may comprise a chassis cooling gas inlet passageway. The chassis cooling gas passageway may comprise a chassis cooling gas outlet passageway. Each sealing retainer may comprise a rotational drive member coupled to move the gas seal body between retracted and extended positions.

In an example, at least one cooling gas manifold may be coupled to the chassis. The at least one cooling gas manifold may comprise an inlet cooling gas manifold and an outlet cooling gas manifold. Each electronic module may comprise a circuit board having a cooling gas path associated therewith. The chassis may comprise a plurality of electronic module mounting rails to slidably receive each electronic module.

Another aspect is directed to a method of mounting an electronic module in an electronic module mounting position of a chassis. The electronic module mounting position may have a chassis cooling gas passageway, and the electronic module may have a module cooling gas passageway. The method may comprise coupling a sealing retainer between the chassis and the electronic module, the sealing retainer having a cooling gas passageway therethrough aligned with the chassis cooling gas passageway and the module cooling gas passageway. The sealing retainer may comprise a retainer body and a gas seal body coupled to the retainer body and movable between retracted and extended positions. The gas seal body in the retracted position may permit insertion and removal of the electronic module, and the gas seal body in the extended position may seal against the electronic module.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION

The present description is made with reference to the accompanying drawings, in which exemplary embodiments are shown. However, many different embodiments may be used, and thus, the description should not be construed as limited to the particular embodiments set forth herein. Rather, these embodiments are provided so that this disclosure will be thorough and complete. Like numbers refer to like elements throughout.

Figure 1:
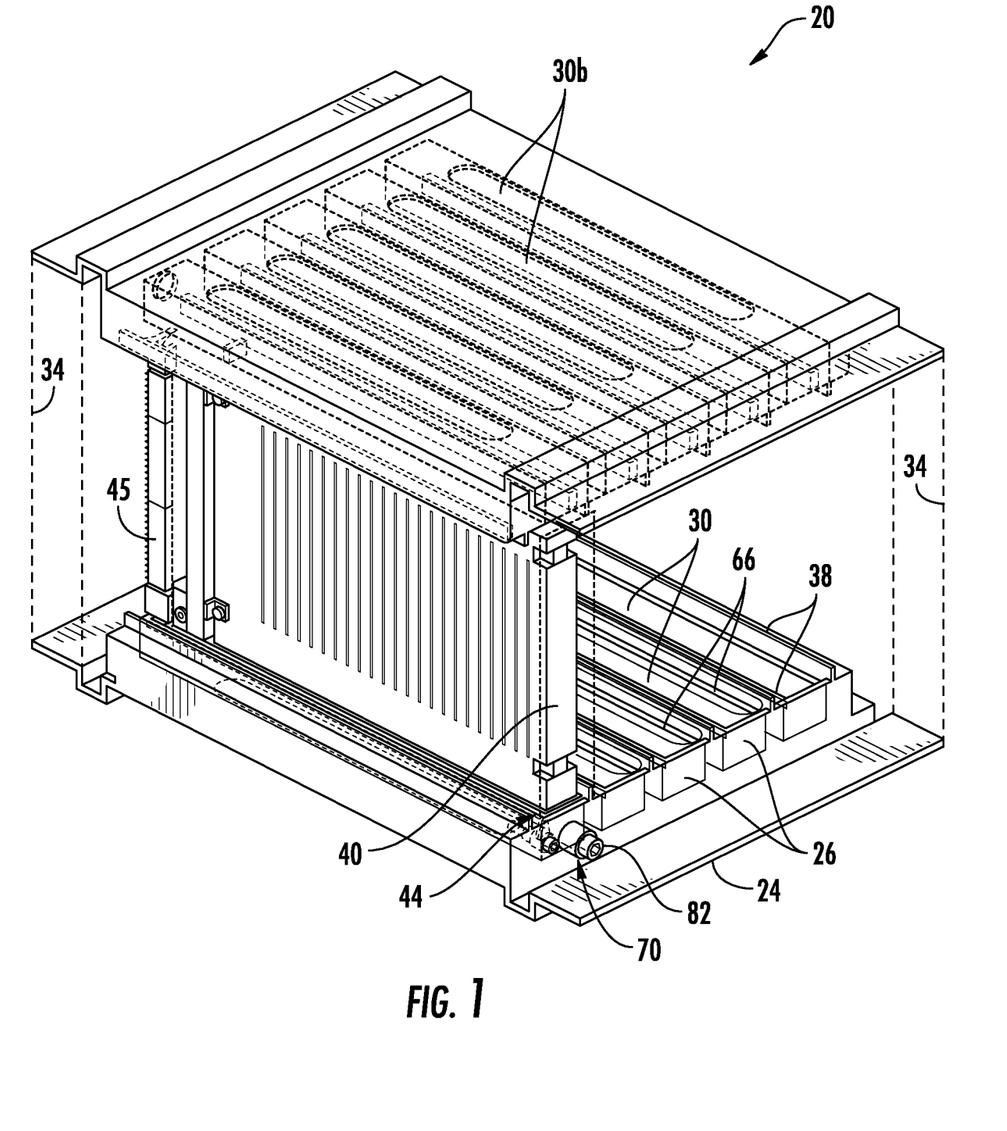
FIG. 1 is an isometric view of the electronic assembly showing a sealing retainer coupled between the chassis and electronic module in accordance with an example embodiment.
Figure 2:
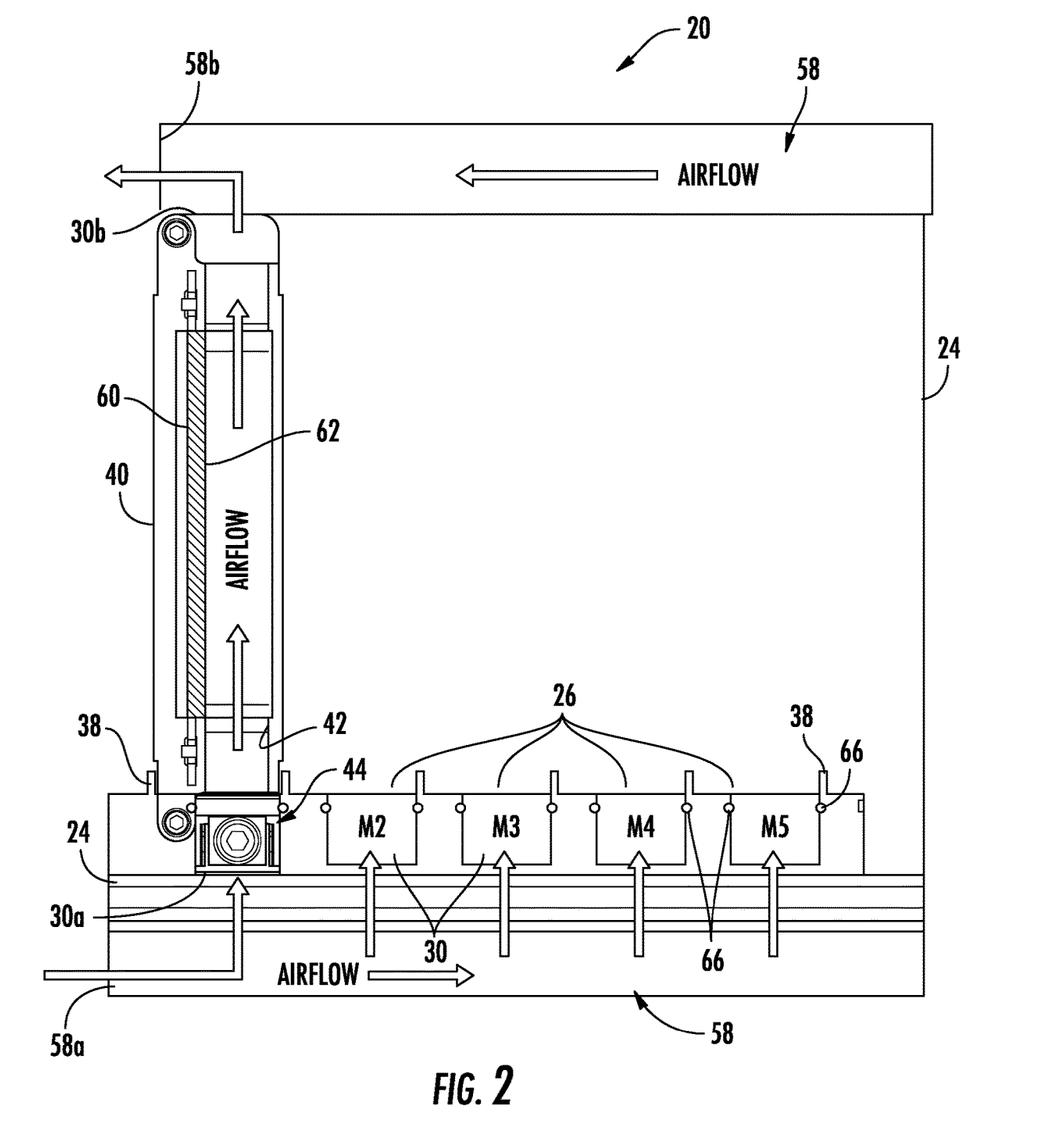
FIG. 2 is a partial sectional view of the electronic assembly of FIG. 1 showing the sealing retainer coupling an electronic module at an electronic module mounting position.
Figure 3:
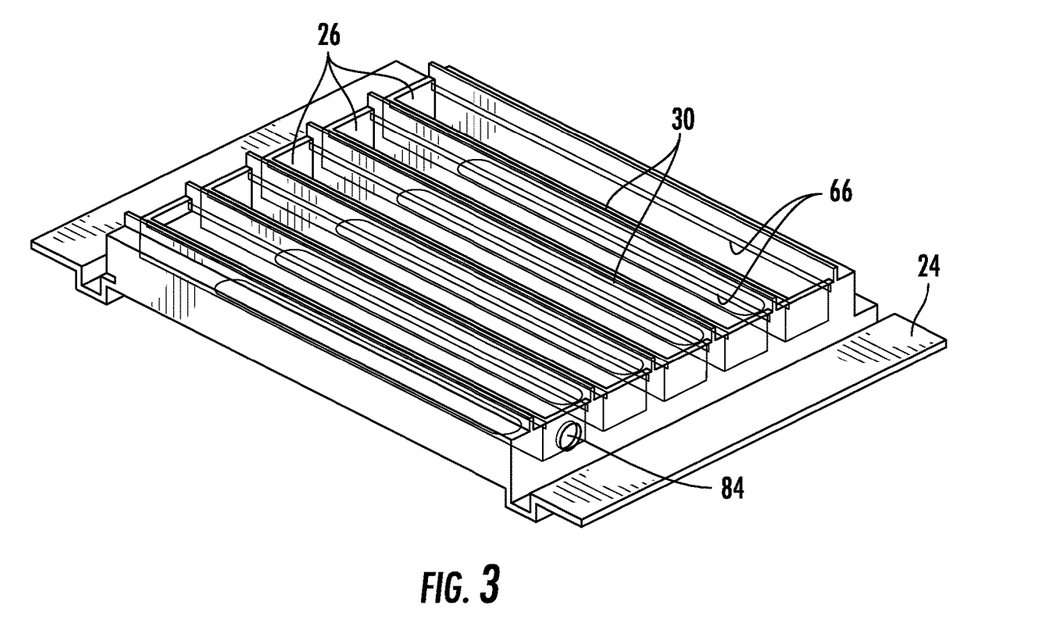
FIG. 3 is an isometric view of the lower section of the chassis showing the electronic module mounting positions and mounting rails to slidably receive electronic modules.
Figure 4:
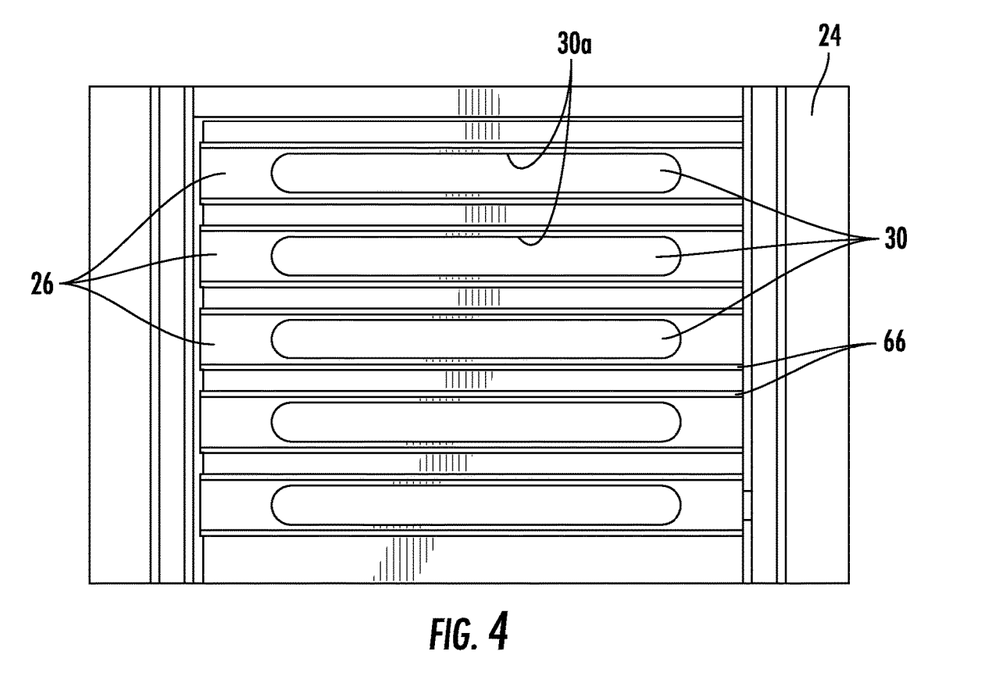
FIG. 4 is a top plan view of the lower section of the chassis shown in FIG. 3.

Referring initially to FIGS. 1-4, an electronic assembly is shown generally at 20 and includes a chassis 24 having a plurality of electronic module mounting positions 26, each having a chassis cooling gas passageway 30 as best shown in FIG. 2-4. The electronic assembly 20 shown in FIG. 1 does not show its complete sidewalls for the chassis 24 in detail, and portions of the sidewalls are outlined by the dashed lines at 34 for purposes of illustrating the configuration of the electronic assembly.

The chassis includes a plurality of electronic module mounting rails 38 at each electronic module mounting position 26 that slidably receive a respective electronic module 40 as shown in FIGS. 1 and 2, where for purposes of illustration, only one electronic module is shown as received in the first electronic module mounting position, leaving four remaining electronic module mounting positions, which each mount an electronic module (shown by the legend M2, M3, M4 and M5), through which air may flow upward in a vertical direction through the chassis cooling gas passageway 30. Each electronic module 40 includes a module cooling gas passageway 42 (FIG. 2) that receives cooling gas that flows upward through each chassis cooling gas passageway 30 into the electronic module.

The chassis cooling gas passageway 30 includes a chassis cooling gas inlet passageway 30a at the lower section of the chassis 24 through which the cooling gas enters (FIGS. 2 and 4). Cooling gas exits out from the electronic module 40 at a chassis cooling gas outlet passageway 30b at the upper section of the chassis 24 (FIG. 1). A respective sealing retainer indicated generally at 44 is coupled between the chassis 24 and each electronic module 40 as shown in FIGS. 1, 2 and 5-9. The sealing retainer 44 includes a cooling gas passageway 46 therethrough (FIG. 7) that is aligned with the chassis cooling gas passageway 30 and the module cooling gas passageway 42 to allow gas to flow upward through the lower section of the chassis 24 and the chassis cooling gas inlet passageway 30a, through the cooling gas passageway 46 in the sealing retainer 44, and upward through the module cooling gas passageway 42 in the electronic module 40 and out through the chassis cooling gas outlet passageway 30b.

Figure 8:
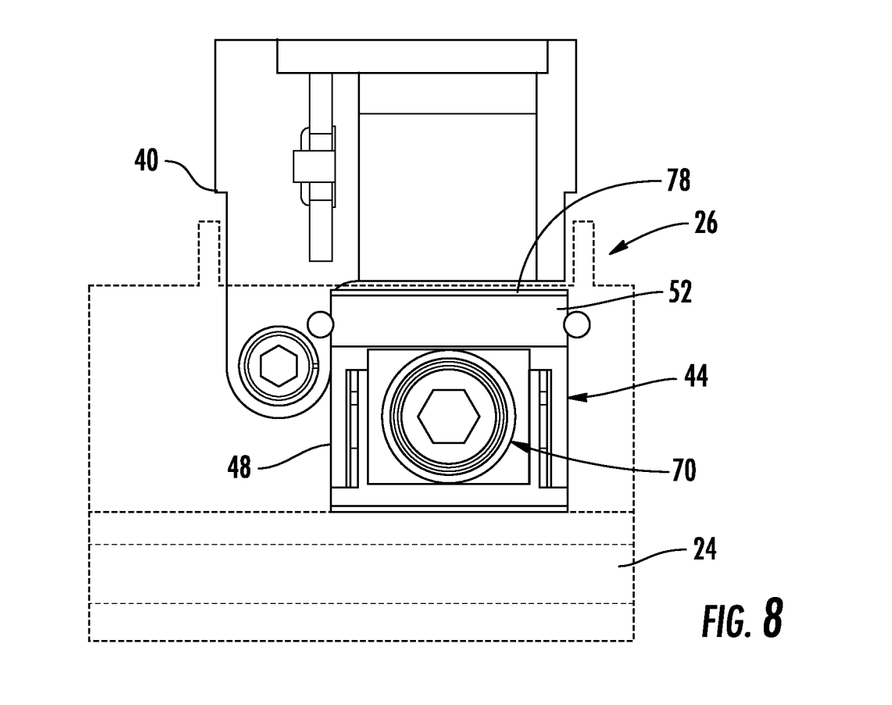
FIG. 8 is a sectional view of the lower section of the chassis and showing a sealing retainer having its gas seal body in a retracted position.
Figure 9:
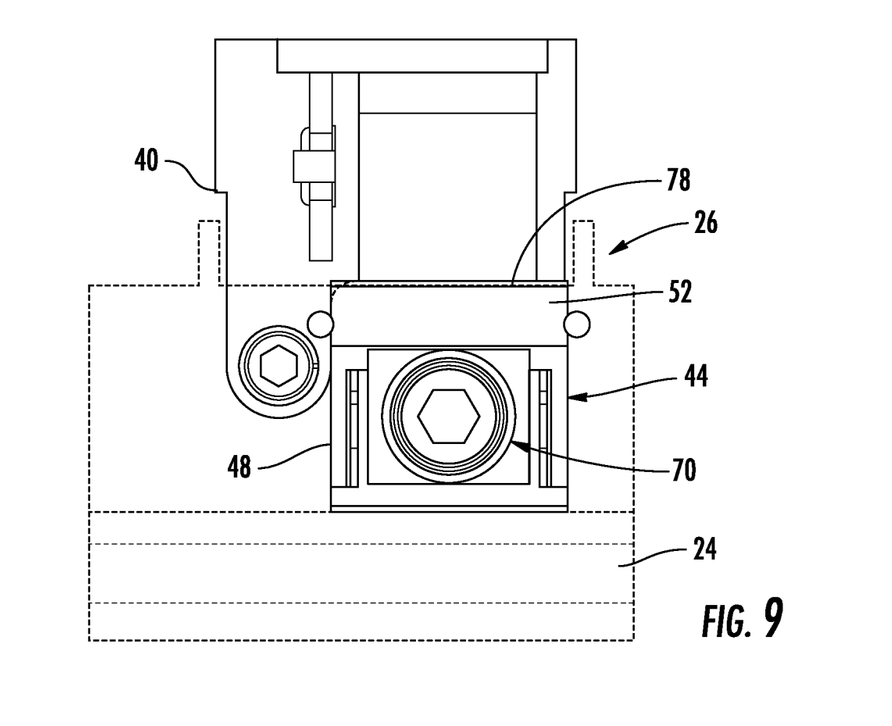
FIG. 9 is another sectional view similar to that shown in FIG. 8 and showing the gas seal body in its extended position sealing against the electronic module.
Figure 10A:
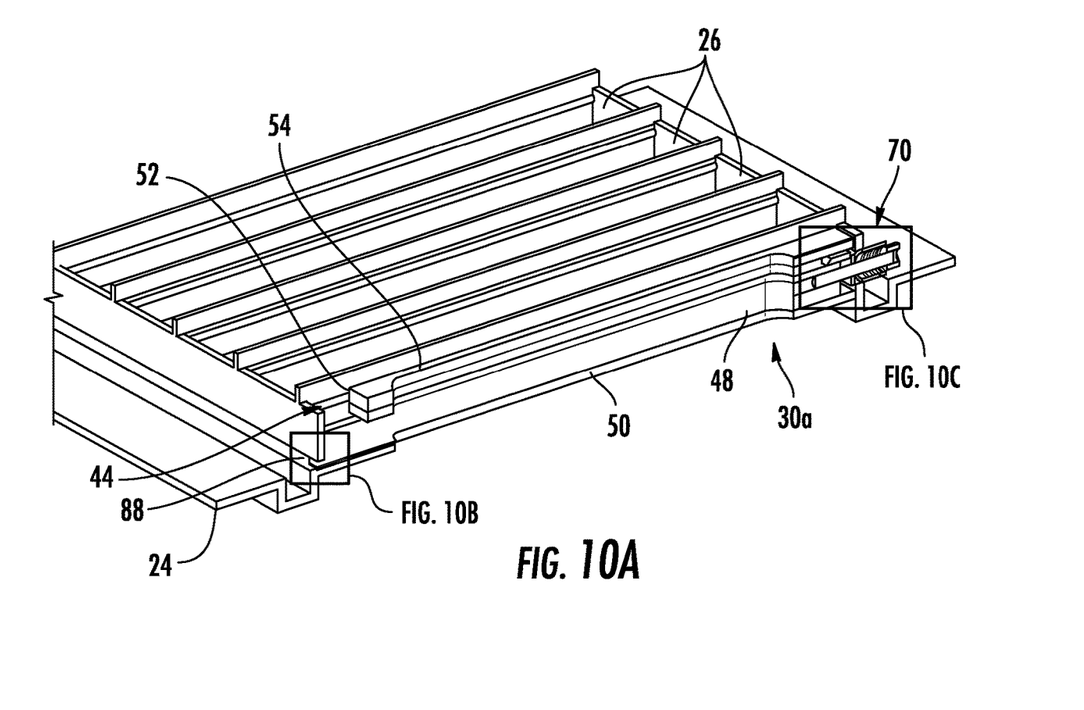
FIG. 10A is a broken isometric view of the lower end of the chassis showing a sealing retainer received within the electronic module mounting position.

As perhaps best shown in FIGS. 8 and 9, the sealing retainer 44 is coupled between the chassis 24 and the electronic module 40. The sealing retainer 44 includes a retainer body 48 that is coupled to the chassis 24 and has a first cooling gas passageway 50 (FIG. 10A) therethrough that is aligned with the chassis cooling gas passageway 30, and more particularly, the chassis cooling gas inlet passageway 30a. The sealing retainer 44 also includes a gas seal body 52 having a second cooling gas passageway 54 (FIG. 6) aligned with the first cooling gas passageway 50 and aligned with the module cooling gas passageway 42 when the electronic module 40 is received in the respective electronic module mounting position 26.

Figure 5:
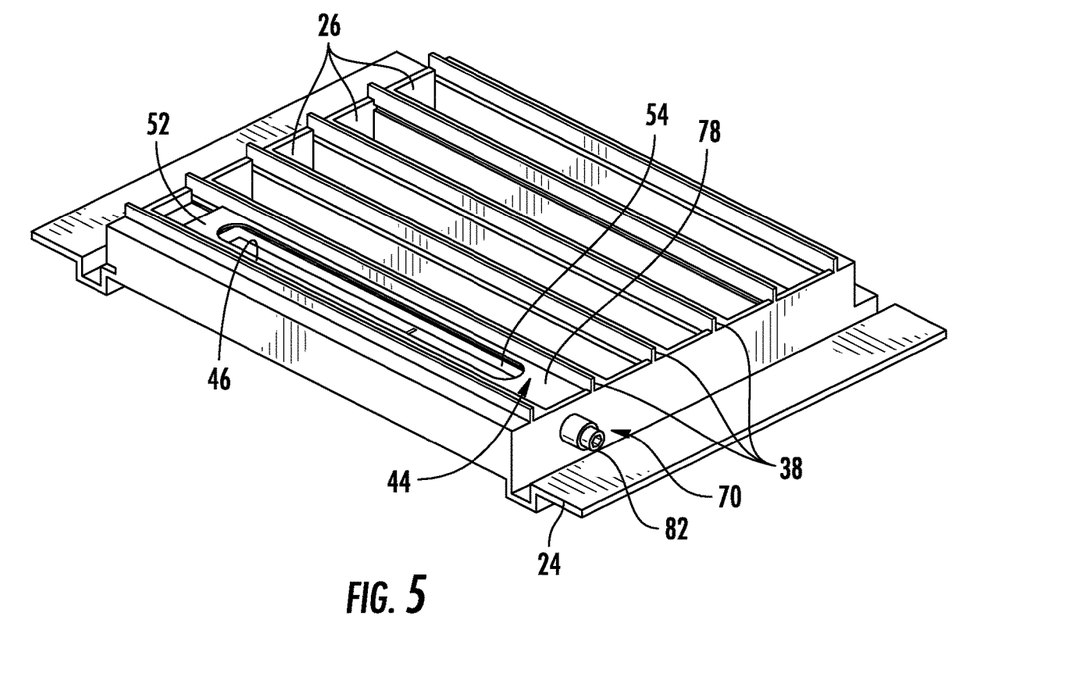
FIG. 5 is an isometric view of the lower section of the chassis showing a sealing retainer positioned within an electronic module mounting position.

The gas seal body 52 is coupled to the retainer body 48 and movable between retracted and extended positions (FIGS. 11-14). The gas seal body 52 in the retracted position permits insertion and removal of the electronic module 40 by slidably inserting or removing the electronic module on the electronic module mounting rails 38, such as shown in FIGS. 5 and 8, where the gas seal body 52 is in the retracted position. In this retracted position, an electronic module 40 may be slidably received on the electronic module mounting rails 38 of the chassis 24. This configuration facilitates insertion and removal of different electronic modules 40 for maintenance and repair, component upgrades, and other purposes.

The gas seal body 52 is also movable into its extended position that allows sealing against the electronic module 40 (FIG. 9). To provide gas flow into and out from the chassis cooling gas passageway 30, at least one cooling gas manifold 58 is coupled to the chassis 24 and includes an inlet cooling gas manifold 58a that provides a gas inflow and outlet cooling gas manifold 58b, with both shown in FIG. 2. The cooling gas manifold 58 allows airflow into the chassis cooling gas passageway inlet 30a of the chassis 24 and through the sealing retainer 44 and its cooling gas passageway 46, through the electronic module 40, and outward through the chassis via the outlet cooling gas manifold 58b. Each electronic module 40 may include a circuit board 60 having a cooling gas path 62 associated therewith as shown in the cross-section view of FIG. 2, indicating that the circuit board 60 and its cooling gas path are associated therewith and provided for air flow by the module cooling gas passageway 42. Any electronic components mounted on the circuit board 60 are cooled by the direct gas (air) flow adjacent the metal or other support to which the circuit board is coupled. The electronic module 40 also includes an electrical backplane connector 45 carried by an end of the circuit board 60 (FIG. 1). In the illustrated embodiment, opposing sides of the electronic module 40 are parallel rather than tapered.

As shown in FIGS. 1-5, a respective sealing gasket 66 is positioned on the inside surface of the electronic module mounting rails 38 to form a seal between the gas seal body 52 of the sealing retainer 44 and those adjacent portions of the chassis 24. In this example, the sealing gasket 66 is located on the inside side surface section of the electronic module mounting rails 38, but the sealing gasket could also be located on the side of the gas seal body 52 near its top section to provide sealing between each gas seal body and the adjacent portions of the chassis 24.

Figure 6:
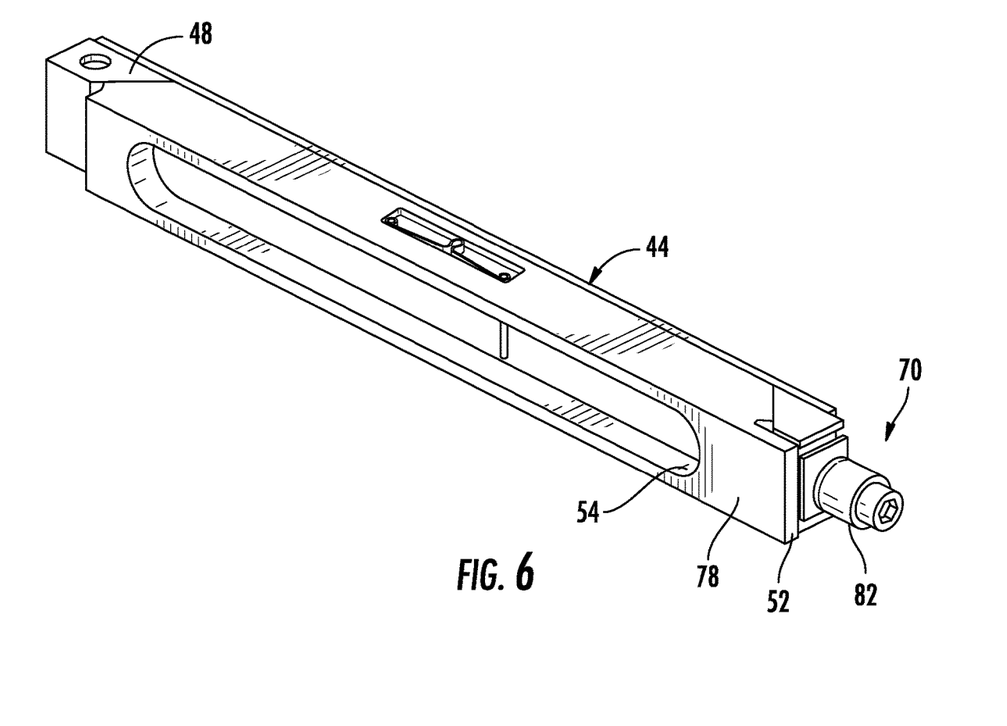
FIG. 6 is an isometric view of a sealing retainer showing the cooling gas passageway.
Figure 7:
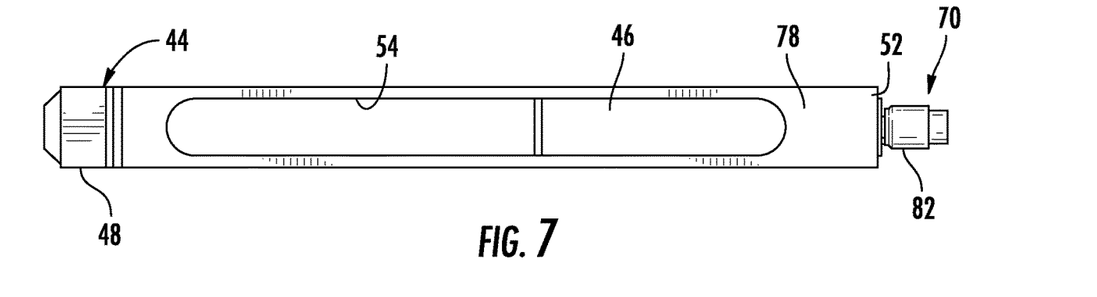
FIG. 7 is a top plan view of the sealing retainer shown in FIG. 6.

Each sealing retainer 44 includes a rotational drive member indicated generally at 70 coupled to move the gas seal body 52 between retracted and extended positions as best shown in FIGS. 10A, 10C, 11 and 12. The rotational drive member 70 includes a threaded shaft 72 as shown in the cut-out section illustrated at 74 of FIG. 11, and at least one wedge 76 carried by the threaded shaft, and, in the example shown in FIGS. 11 and 12, a wedge at each end of the gas seal body 52. Each end of the threaded shaft 72 is connected to the wedge 76, such that as the threaded shaft is rotated, the inclined or sloped side of the wedges may move upward against the retainer body 48, which also includes an inclined section at each end. This structure and wedges 76 allow the gas seal body 52 to extend outward in a vertical direction from the retainer body 48 to facilitate the gas seal body 52 to seal against the lower section of the electronic module 40 via a module sealing gasket 78 carried by the gas seal body as best shown in FIGS. 5-7. When the gas seal body 52 is extended, the second cooling gas passageway 54 of the sealing retainer 44 is aligned and in sealed connection with the module cooling gas passageway 42, providing gas flow without leakage into that passageway to cool electronic components on the circuit board 60.

A chassis sealing gasket 80 (FIGS. 11-14) may also be carried by the retainer body 48 to engage with the lower section of the chassis 24 when the sealing retainer 44 is received within an electronic module mounting position 26 of the chassis. As illustrated, each retainer body 48 has an elongate, generally rectangular shape such that it fits within the chassis 24 at each electronic module mounting position 26 that have vertical walls forming the mounting rails 38 on which the sealing retainers 44 are received. The rotational drive member 70 includes a removable drive head 82 as best shown in FIG. 10C, coupled to a first end of the threaded shaft 72.

In operation, the sealing retainer 44 is first positioned within the electronic module mounting position 26 within the chassis 24 when the removable drive head 82 has been removed. When the sealing retainer 44 is seated within the electronic module mounting position 26, the removable drive head 82 is inserted through an orifice 84 (FIGS. 3 and 10C) positioned in the sidewall of the chassis 24 at the electronic module mounting position to engage the threaded shaft 72 to drive and rotate the threaded shaft, and, thus, retract or extend the gas seal body 52 upon rotation of the removable drive head 82.

Figure 10B:
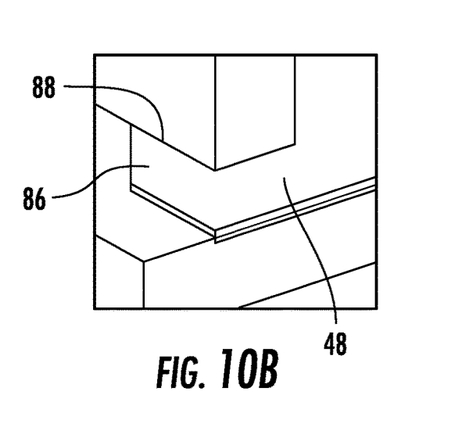
FIG. 10B is an enlarged isometric view of the sealing retainer showing the chassis mounting lip that engages the chassis.
Figure 10C:
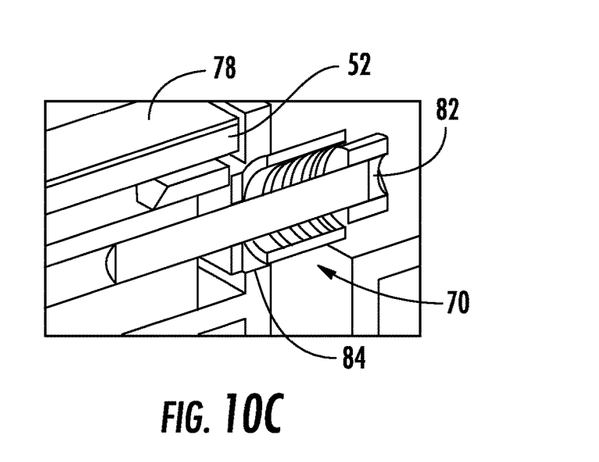
FIG. 10C is another enlarged isometric view of the drive member coupled to move the gas seal body between retracted and extended positions.
Figure 11:
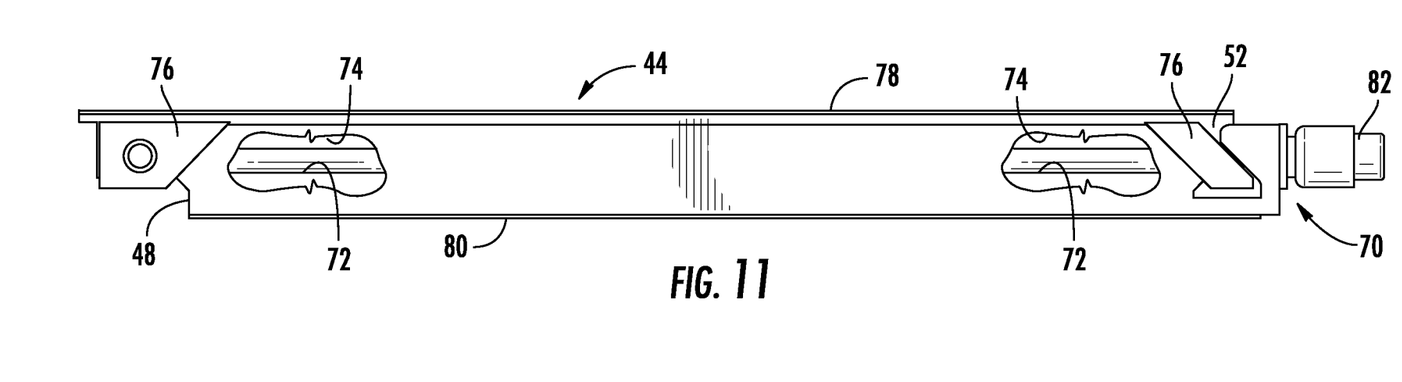
FIG. 11 is a side sectional view of the sealing retainer with its gas seal body in its retracted position and showing the threaded shaft in the partial breakaway sections.
Figure 12:
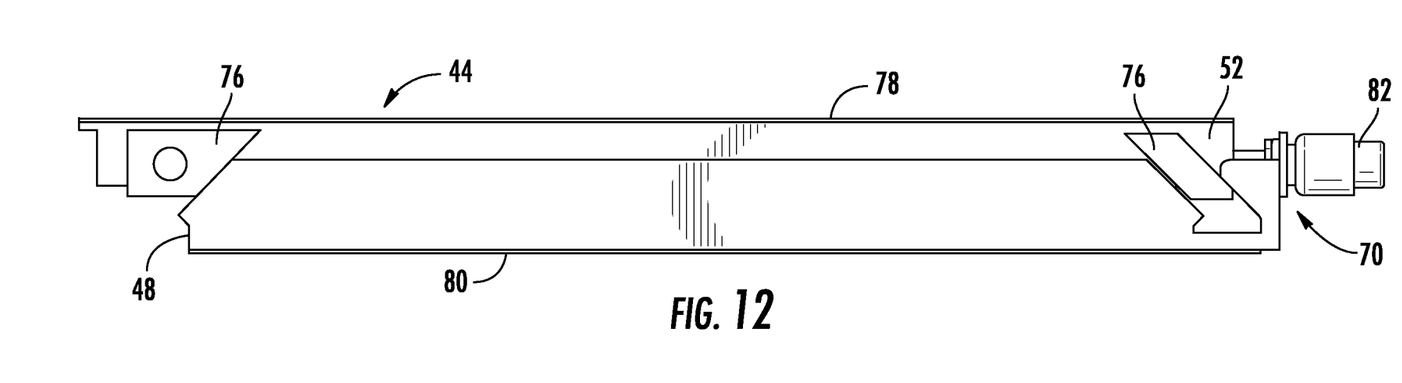
FIG. 12 is another sectional view of the sealing retainer similar to that in FIG. 11, but showing the gas seal body in its extended position.

As shown in the enlarged isometric view of FIG. 10B, the retainer body 48 includes a chassis mounting lip 86 on an end opposite the removable drive head 82 and adjacent a second end of the threaded shaft 72. The chassis mounting lip 86 is received into a slot 88 formed in the sidewall of the chassis 24 and helps retain the retainer body 48 within the chassis, and, thus, retain the sealing retainer 44 within the chassis 24. Likewise, when the removable drive head 82 is inserted through the orifice 84 within the sidewall of the chassis 24 to engage the threaded shaft 72, the removable drive head 82 also helps retain the sealing retainer 44 and its retainer body 48 within the electronic module mounting position 26 of the chassis 24.

Figure 13:
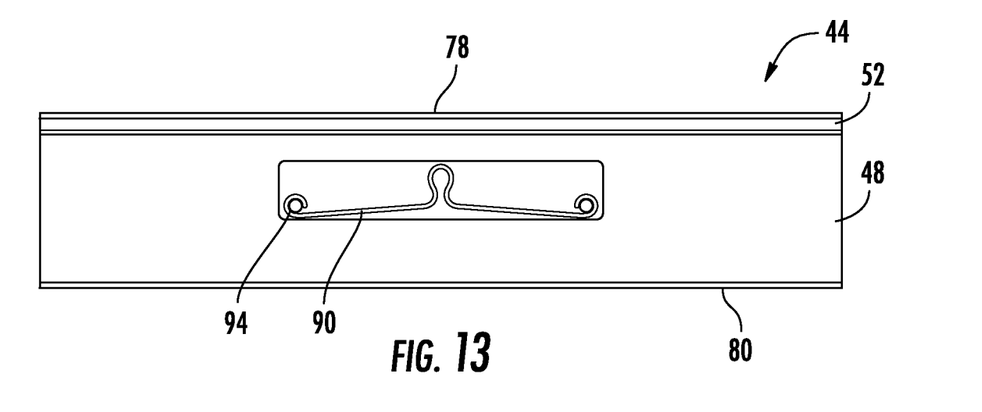
FIG. 13 is a broken sectional view of a portion of the sealing retainer showing the biasing member coupled between the retainer body and gas seal body when the gas seal body is in its retracted position.
Figure 14:
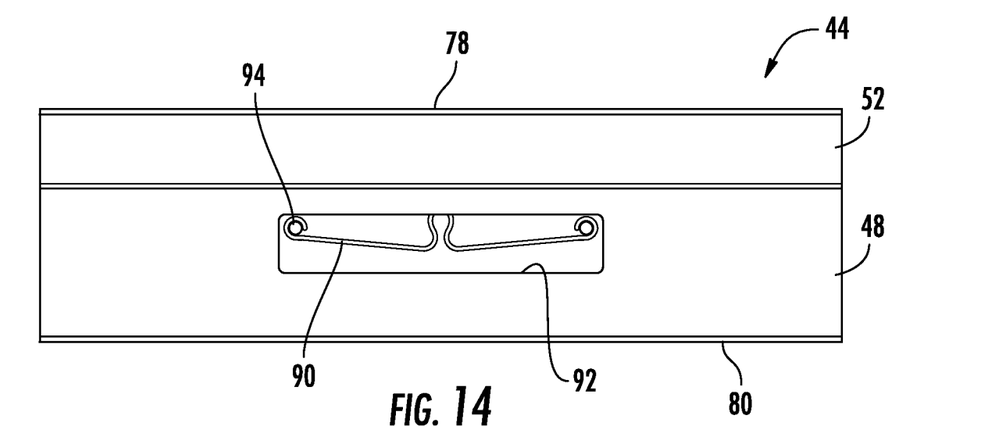
FIG. 14 is a view similar to that shown in FIG. 13 showing the biasing member when the gas seal body is in its extended position.

As perhaps best shown in FIGS. 13 and 14, a biasing member is received in a central cavity 92 formed within retainer body 48 and coupled between the retainer body and a gas seal body 52 and formed as a leaf spring 90 held by pins 94 connected into the movable gas seal body. When the gas seal body 52 is extended (FIG. 14), the biasing member formed as the leaf spring 90 engages the top surface of the central cavity 92 and exerts a downward, vertical force against the retainer body 48, biasing the gas seal body 52 back into its retracted position when the removable drive head 82 is rotated to permit removal of the electronic module 40 retained in that respective electronic module mounting position 26 and insertion of a new electronic module 40 to replace the older electronic module, which may have been damaged or needs maintenance, or is being replaced with an upgraded electronic module.

Figure 15:
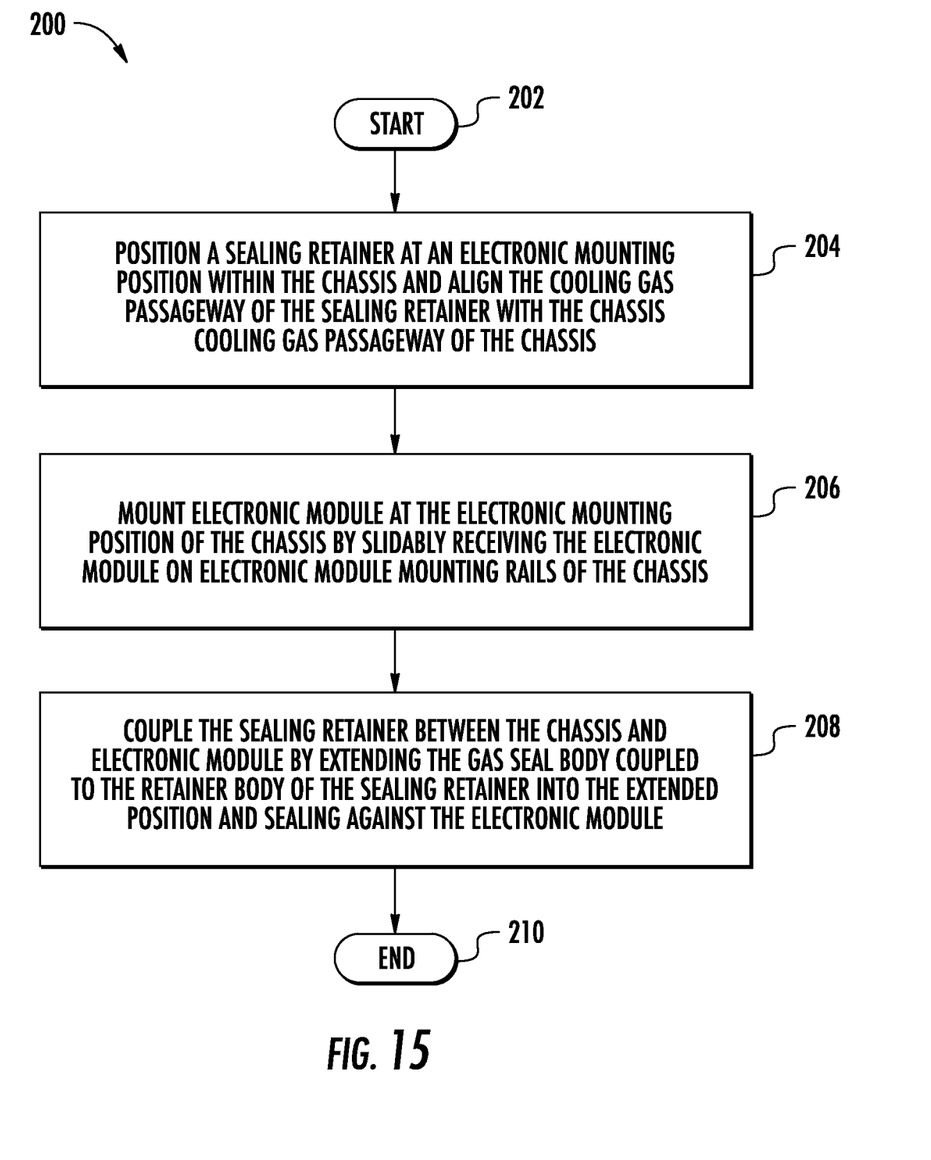
FIG. 15 is a high level flowchart showing a method of mounting an electronic module in the chassis.

Referring now to FIG. 15, there is illustrated a high level flowchart of a method of mounting an electronic module 40 in the electronic module mounting position 26 of the chassis 24, which method is illustrated generally at 200. The process starts (Block 202) and a sealing retainer 44 is positioned at an electronic mounting position 26 within the chassis 24, and the cooling gas passageway 46 of the sealing retainer is aligned with the chassis cooling gas passageway 30 of the chassis (Block 204). An electronic module 40 is mounted at the electronic mounting position 26 of the chassis 24 by slidably receiving the electronic module on the electronic module mounting rails 38 of the chassis (Block 206). The sealing retainer 44 is coupled between the chassis 24 and electronic module 40 by extending the gas seal body 52 coupled to the retainer body 48 of the sealing retainer into the extended position and sealing against the electronic module (Block 208). The process ends (Block 210).

Figure 16:
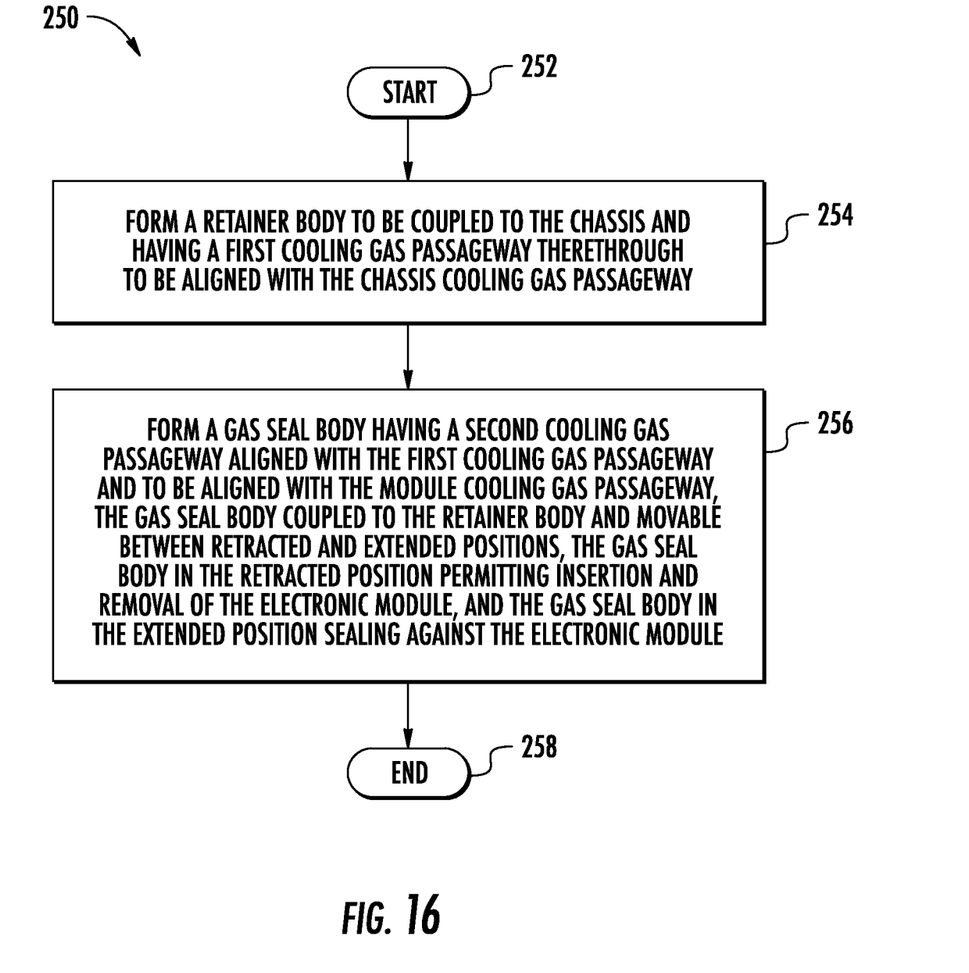
FIG. 16 is a high level flowchart showing the method of making a sealing retainer to be coupled between the chassis and electronic module.

Referring now to FIG. 16, there is illustrated at Block 250, a high level flowchart of a method of making a sealing retainer 44 to be coupled between a chassis 24 and electronic module 40. The process starts (Block 252). A retainer body 48 is formed to be coupled to the chassis 24 and having a first cooling gas passageway 50 therethrough to be aligned with the chassis cooling gas passageway 30 (Block 254). A gas seal body 52 is formed having a second cooling gas passageway 54 aligned with the first cooling gas passageway 50 and to be aligned with the module cooling gas passageway 42. The gas seal body 52 is coupled to the retainer body 48 and movable between retracted and extended positions. The gas seal body 52 in the retracted position permits insertion and removal of the electronic module 40. The gas seal body 52 in the extended position seals against the electronic module 40 (Block 256). The process ends (Block 258).

The electronic assembly 20 that includes the chassis 24 and sealing retainer 44 may be used for air flow through (AFT), cooled plug-in modules in both the 3U and the 6U form factor. The sealing retainer 44 includes the retraction function for its gas seal body 52 imparted by the integrated biasing member formed as a leaf spring 90 for example. The sealing retainer 44 includes its retainer body 48 and the first cooling gas passageway 50 that may be aligned with the chassis cooling gas passageway 30, and the gas seal body 52 having its second cooling gas passageway 54 aligned with the first cooling gas passageway 50, which can be aligned with the module cooling gas passageway 42. Cooling capabilities are increased because the fluid flow, such as the air flow, is confined to the electronic module 40 near the circuit board 60 and its cooling gas path 62 associated therewith.

It is also possible to allow heat conduction into a wall of the chassis 24 using a thermally conducting material positioned at the top of the electronic module 40. The electronic assembly 20 with the sealing retainer 44 provides an efficient design without the necessity for a taper, such as required with other state-of-the-art VITA 48.8 AFT compliant designs. There is also no requirement for gasket compression, and thus, there is no wear between the chassis 24 and the electronic module 40 during insertion or removal of the electronic module.

This application is related to a copending patent application entitled, "SEALING RETAINER TO BE COUPLED BETWEEN CHASSIS AND ELECTRONIC MODULE AND ASSOCIATED METHOD," which is filed on the same date and by the same assignee and inventors, the disclosure which is hereby incorporated by reference.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. An electronic assembly comprising:
a chassis having a plurality of electronic module mounting positions, each electronic module mounting position having a chassis cooling gas passageway;
a respective electronic module received in each electronic module mounting position and having a module cooling gas passageway; and
a respective sealing retainer coupled between the chassis and each electronic module, the sealing retainer having a retainer cooling gas passageway therethrough aligned with the chassis cooling gas passageway and the module cooling gas passageway, the sealing retainer comprising
a retainer body coupled to the chassis, and
a gas seal body coupled to the retainer body and movable relative to the retainer body between retracted and extended positions, the gas seal body in the retracted position permitting insertion and removal of the respective electronic module, and the gas seal body in the extended position extending outwardly from the retainer body to seal against the respective electronic module at the module cooling gas passageway.

2. The electronic assembly of claim 1, comprising a respective sealing gasket between each gas seal body and adjacent portions of the chassis.

3. The electronic assembly of claim 1, wherein the chassis cooling gas passageway comprises a chassis cooling gas inlet passageway.

4. The electronic assembly of claim 1, wherein the chassis cooling gas passageway comprises a chassis cooling gas outlet passageway.

5. The electronic assembly of claim 1, wherein each sealing retainer comprises a rotational drive member coupled to move the gas seal body between the retracted and extended positions.

6. The electronic assembly of claim 1, comprising at least one cooling gas manifold coupled to the chassis.

7. The electronic assembly of claim 6, wherein the at least one cooling gas manifold comprises an inlet cooling gas manifold and an outlet cooling gas manifold.

8. The electronic assembly of claim 1, wherein each electronic module comprises a circuit board having a cooling gas path associated therewith.

9. The electronic assembly of claim 1, wherein the chassis comprises a plurality of electronic module mounting rails to slidably receive each electronic module.

10. An electronic assembly comprising:
a chassis having a plurality of electronic module mounting positions, each electronic module mounting position having a chassis cooling gas passageway;
a respective electronic module received in each electronic module mounting position and having a module cooling gas passageway;
a respective sealing retainer coupled between the chassis and each electronic module, the sealing retainer having a retainer cooling gas passageway therethrough aligned with the chassis cooling gas passageway and the module cooling gas passageway, the sealing retainer comprising
a retainer body coupled to the chassis,
a gas seal body coupled to the retainer body and movable relative to the retainer body between retracted and extended positions, the gas seal body in the retracted position permitting insertion and removal of the respective electronic module, and the gas seal body in the extended position extending outwardly from the retainer body to seal against the respective electronic module at the module cooling gas passageway, and
a rotational drive member coupled to move the gas seal body between the retracted and extended positions; and
a respective sealing gasket between each gas seal body and adjacent portions of the chassis.

11. The electronic assembly of claim 10, wherein the chassis cooling gas passageway comprises a chassis cooling gas inlet passageway.

12. The electronic assembly of claim 10, wherein the chassis cooling gas passageway comprises a chassis cooling gas outlet passageway.

13. The electronic assembly of claim 10, comprising at least one cooling gas manifold coupled to the chassis.

14. The electronic assembly of claim 13, wherein the at least one cooling gas manifold comprises an inlet cooling gas manifold and an outlet cooling gas manifold.

15. The electronic assembly of claim 10, wherein each electronic module comprises a circuit board having a cooling gas path associated therewith.

16. The electronic assembly of claim 10, wherein the chassis comprises a plurality of electronic module mounting rails to slidably receive each electronic module.

17. A method of mounting an electronic module in an electronic module mounting position of a chassis, the electronic module mounting position having a chassis cooling gas passageway, and the electronic module having a module cooling gas passageway, the method comprising:
coupling a sealing retainer between the chassis and the electronic module, the sealing retainer having a retainer cooling gas passageway therethrough aligned with the chassis cooling gas passageway and the module cooling gas passageway, the sealing retainer comprising
a retainer body coupled to the chassis, and a gas seal body coupled to the retainer body and movable relative to the retainer body between retracted and extended positions, the gas seal body in the retracted position permitting insertion and removal of the electronic module, and the gas seal body in the extended position extending outwardly from the retainer body to seal against the electronic module at the module cooling gas passageway.

18. The method of claim 17, comprising coupling a respective sealing gasket between the gas seal body and adjacent portions of the chassis.

19. The method of claim 17, wherein the chassis cooling gas passageway comprises a chassis cooling gas inlet passageway.

20. The method of claim 17, wherein the chassis cooling gas passageway comprises a chassis cooling gas outlet passageway.

21. The method of claim 17, wherein the sealing retainer comprises a rotational drive member coupled to move the gas seal body between the retracted and extended positions.

22. The method of claim 17, wherein the chassis comprises a plurality of electronic module mounting rails to slidably receive the electronic module.

* * * * *